United States Patent
Ma et al.

(10) Patent No.: US 10,268,085 B2
(45) Date of Patent: Apr. 23, 2019

(54) LIQUID CRYSTAL COATING APPARATUS AND LIQUID CRYSTAL COATING METHOD

(71) Applicants: BOE Technology Group Co., Ltd., Beijing (CN); Hefei Xinsheng Optoelectronics Technology Co., Ltd., Hefei (CN)

(72) Inventors: Jian Ma, Beijing (CN); Wenming Ren, Beijing (CN); Yudong Liu, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/513,182

(22) PCT Filed: Jul. 15, 2016

(86) PCT No.: PCT/CN2016/090093
§ 371 (c)(1),
(2) Date: Mar. 22, 2017

(87) PCT Pub. No.: WO2017/124711
PCT Pub. Date: Jul. 27, 2017

(65) Prior Publication Data
US 2018/0039112 A1    Feb. 8, 2018

(30) Foreign Application Priority Data
Jan. 19, 2016   (CN) .......................... 2016 1 0034957

(51) Int. Cl.
*G02F 1/1341*   (2006.01)
*G02F 1/1333*   (2006.01)
(Continued)

(52) U.S. Cl.
CPC .......... *G02F 1/1341* (2013.01); *B05C 5/0225* (2013.01); *G02F 1/1303* (2013.01);
(Continued)

(58) Field of Classification Search
CPC ............. G02F 1/1333; G02F 1/133365; G02F 1/133382; G02F 1/133385; G02F 1/1303; G02F 1/1341; G02F 2001/3505
See application file for complete search history.

(56) References Cited

U.S. PATENT DOCUMENTS

| 2004/0233373 A1* | 11/2004 | Ogimoto ............... G02F 1/1341 349/153 |
| 2007/0235062 A1* | 10/2007 | Fujiwara ............. C03C 23/0075 134/4 |
| 2015/0020852 A1 | 1/2015 | Kato et al. |

FOREIGN PATENT DOCUMENTS

| CN | 1572379 A | 2/2005 |
| CN | 1699058 A | 11/2005 |

(Continued)

OTHER PUBLICATIONS

Jun. 9, 2017—(CN) Office Action Appn 201610034957.7 with English Translation.
(Continued)

*Primary Examiner* — Thoi V Duong
(74) *Attorney, Agent, or Firm* — Banner & Witcoff, Ltd.

(57) ABSTRACT

A liquid crystal coating apparatus and a liquid crystal coating method are provided. The liquid crystal coating apparatus comprises a liquid crystal nozzle and a cooling device, the cooling device is located behind the nozzle along a movement trace of the nozzle, and the cooling device moves along the movement trace of the nozzle.

13 Claims, 1 Drawing Sheet

(51) Int. Cl.
*H01L 21/67* (2006.01)
*B05C 5/02* (2006.01)
*G02F 1/13* (2006.01)
*G02F 1/35* (2006.01)

(52) U.S. Cl.
CPC .......... *H01L 21/67* (2013.01); *H01L 21/6715* (2013.01); *H01L 21/67109* (2013.01); *G02F 2001/3505* (2013.01)

(56) References Cited

FOREIGN PATENT DOCUMENTS

| | | |
|---|---|---|
| CN | 201429756 Y | 3/2010 |
| CN | 102253539 A | 11/2011 |
| CN | 103529582 A | 1/2014 |
| CN | 105487302 A | 4/2016 |
| JP | 2002365650 A | 12/2002 |

OTHER PUBLICATIONS

Oct. 25, 2016—(WO) International Search Report and Written Opinion Appn PCT/CN2016/090093 with English Tran.

\* cited by examiner

LIQUID CRYSTAL COATING APPARATUS AND LIQUID CRYSTAL COATING METHOD

The application is a U.S. National Phase Entry of International Application No. PCT/CN2016/090093 filed on Jul. 15, 2016, designating the United States of America and claiming priority to Chinese Patent Application No. 201610034957.7 filed Jan. 19, 2016. The present application claims priority to and the benefit of the above-identified applications and the above-identified applications are incorporated by reference herein in their entirety.

TECHNICAL FIELD

Embodiments of the present disclosure relate to a liquid crystal coating apparatus and a liquid crystal coating method.

BACKGROUND

Currently, a thin film transistor liquid crystal display (TFT-LCD) of high-quality, low power consumption and non-radiation has become a mainstream in a display market.

A major component of the liquid crystal display is a liquid crystal panel. The liquid crystal panel includes an array substrate and an opposed substrate arranged opposite to each other, and a liquid crystal layer arranged between the array substrate and the opposed substrate. During the process of bonding the array substrate and the opposed substrate to form the liquid crystal panel, filling liquid crystal of the liquid crystal layer is a critical step, which comprises: filling the liquid crystal between the array substrate and the opposed substrate by a filling apparatus such as an ink-jet printing apparatus, and then coating a sealant between the array substrate and the opposed substrate under a vacuum condition to bond the array substrate and the opposed substrate together and to seal the liquid crystal layer between the array substrate and the opposed substrate. Typically, the liquid crystal and the sealant are respectively coated on different substrates. The sealant is a translucent colloidal substance at room temperature, and after the array substrate and the opposed substrate are bonded with each other, internal molecules of the sealant need to undergo a cross-linking reaction to be fully cured by a UV curing and a heat curing.

At present, the liquid crystal coated on the substrate may diffuse to the periphery of the substrate, especially, diffuse in a direction of alignment friction to the periphery of the substrate, and come into contact with the sealant before being completely cured; in this case, small molecular substance of the sealant may contaminate the liquid crystal, so that problems such as uneven brightness and residual image occur, which reduces quality and yield of the liquid crystal panel.

SUMMARY

According to embodiments of the disclosure, a liquid crystal coating apparatus is provided. The liquid crystal apparatus comprises a liquid crystal nozzle and a cooling device, the cooling device is located behind the nozzle along a movement trace of the nozzle, and the cooling device moves along the movement trace of the nozzle.

For example, the cooling device includes a gas path system and a gas injection chamber, the gas injection chamber communicating with a gas storage device through the gas path system.

For example, the gas path system is provided with a flow valve for controlling gas flow.

For example, a bottom of the gas injection chamber is provided with a slit-type gas outlet.

For example, the gas injection chamber is configured for injecting a low-temperature dry gas.

For example, the low-temperature dry gas is nitrogen or carbon dioxide.

For example, the liquid crystal coating apparatus further comprises a hollow square frame, the frame drives the nozzle and the cooling device to move synchronously, and the nozzle and the cooling device are respectively fixed on two sides of the frame along a movement direction of the nozzle and the cooling device.

For example, the liquid crystal coating apparatus further comprises a heat-insulating baffle provided between the nozzle and the cooling device, the heat-insulating baffle is arranged in a direction perpendicular to the movement trace of the nozzle and the cooling device.

For example, as compared with the nozzle, the cooling device is arranged to be closer to the heat-insulating baffle.

For example, a bottom of the nozzle is provided with an injection hole, and a bottom of the heat-insulating baffle is higher than the injection hole of the nozzle.

According to the embodiments of the disclosure, a liquid crystal coating method is provided. The method comprises: S1: coating a liquid crystal having a predetermined pattern on a substrate through a nozzle; and S2: lowering a temperature of the liquid crystal by a cooling device along a movement trace of the nozzle while coating the liquid crystal, so as to lower a fluidity of the liquid crystal.

For example, a sealant is provided in a peripheral region of the substrate, and the method comprises: performing a thermal curing on the sealant, and at the same time raising the temperature of the liquid crystal to restore the fluidity of the liquid crystal.

For example, in the step S2, the cooling device injects a low-temperature dry gas to the substrate through a slit-type gas outlet.

For example, the low-temperature dry gas is nitrogen or carbon dioxide.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
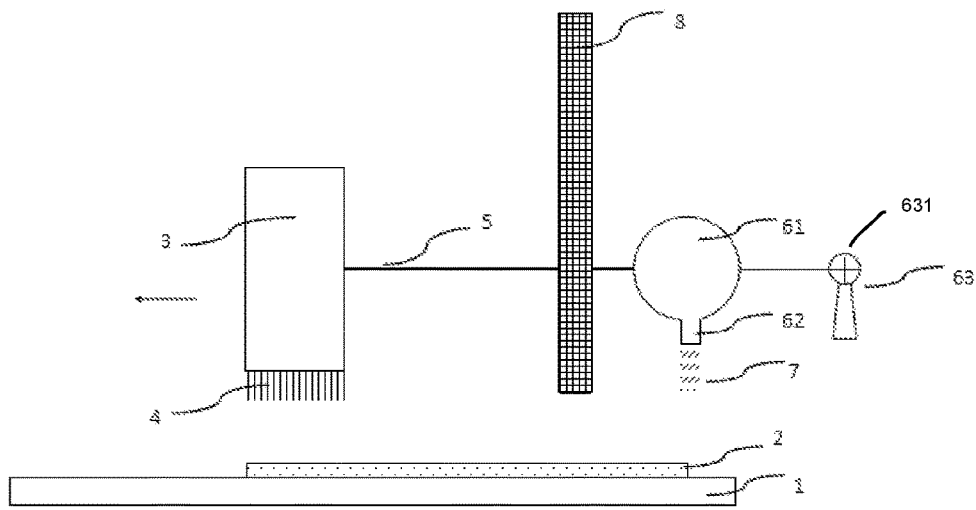
FIG. 1 is a structural schematic view of a liquid crystal coating apparatus according to embodiments of the present disclosure.
Figure 2:
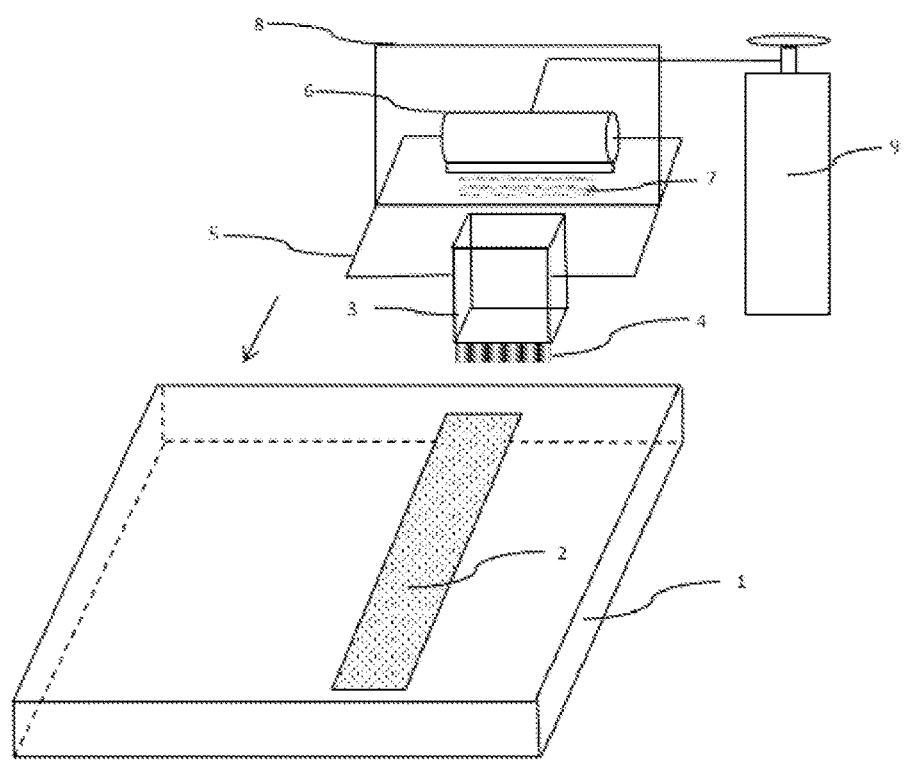
FIG. 2 is a stereoscopic view of the liquid crystal coating apparatus according to the embodiments of the present disclosure.

As shown in FIG. 1 and FIG. 2, embodiments of the present disclosure provide a liquid crystal coating apparatus, and the liquid crystal coating apparatus comprises: a liquid crystal nozzle 3 configured for coating a liquid crystal 2 and a cooling device 6 configured for cooling the coated liquid crystal 2. The cooling device 6 is located behind the nozzle 3 along a movement trace of the nozzle 3, and the cooling device 6 moves along the movement trace of the nozzle 3. The nozzle 3 injects the liquid crystal 2 for example through an injection hole 4 thereof, and at the same time, the cooling device 6 rapidly cooling the liquid crystal 2.

The cooling device 6 includes a gas path system 63 and a gas injection chamber 61, the gas injection chamber 61 communicates with a gas storage device 9 through the gas path system 63, and the gas path system 63 is provided with a flow valve 631 for controlling gas flow. By using the flow valve 631 of the gas path system 63, the amount of the gas flow and a temperature of a low-temperature gas are controlled, so as to mildly apply the low-temperature gas on the liquid crystal 2 coated on a surface of a substrate 1, and thus to achieve a good cooling effect. A bottom of the gas injection chamber 61 is provided with a slit-type gas outlet 62, the slit-type gas outlet 62 is configured for injecting the low-temperature dry gas. By using the slit-type gas outlet 62 to inject the gas, a direction for injecting the gas is concentrated, which is helpful to rapidly cool the liquid crystal 2. The low-temperature dry gas 7 is stored in the gas storage device 9. In the embodiments of the present disclosure, the low-temperature dry gas 7 is, for example, nitrogen or carbon dioxide. Nitrogen and carbon dioxide have a lower cost and a good cooling effect, and ensures that a temperature of the low-temperature dry gas 7 can be selected within a very wide range.

In the embodiments of the present disclosure, the nozzle 3 and the cooling device 6 are both fixed onto a hollow square frame 5, and the frame 5 drives the nozzle 3 and the cooling device 6 to move synchronously, the nozzle 3 and the cooling device 6 are respectfully fixed on two sides of the frame 5 along a movement direction of the nozzle 3 and the cooling device 6, to ensure that the cooling device 6 cools the liquid crystal 2 more timely.

In addition, a heat-insulating baffle 8 is arranged between the nozzle 3 and the cooling device 6, for example, the heat-insulating baffle 8 is arranged in a direction perpendicular to the movement trace of the nozzle 3 and the cooling device 6; and the heat-insulating baffle 8 plays a role in baffling the low-temperature dry gas 7, so as to avoid influence of the low-temperature dry gas 7 on a temperature of the liquid crystal 2 in the nozzle 3, and to ensure a coating property of the liquid crystal 2. For example, the heat-insulating baffle 8 is fixed onto the frame 5 in a direction perpendicular to a movement direction of the frame 5.

In the embodiments of the present disclosure, as compared with the nozzle 3, the cooling device 6 is provided closer to the heat-insulating baffle 8; in other words, the heat-insulating baffle 8 is provided close to the cooling device 6. As a result, the heat-insulating baffle 8 baffles the low-temperature dry gas 7 better. For example, a bottom of the heat-insulating baffle 8 is higher than the injection hole 4 of the nozzle 3, to prevent the heat-insulating baffle 8 from coming into contact with the liquid crystal 2 coated on the surface of the substrate 1.

An operation of the liquid crystal coating apparatus according to the embodiments of the present disclosure is that: the nozzle 3 injects the liquid crystal 2 and coats the liquid crystal 2 on the substrate 1, the cooling device 6 moves along the movement trace of the nozzle 3 and injects the highly-pure low-temperature dry gas 7 (e.g., nitrogen gas or carbon dioxide gas) onto the liquid crystal 2 coated on the substrate 1 through the slit-type gas outlet 62, to cause the temperature of the liquid crystal 2 to decrease rapidly; at a low temperature, a fluidity of the liquid crystal 2 is rapidly lowered and a viscosity coefficient of the liquid crystal 2 is significantly increased, which effectively avoids the diffusion of the liquid crystal 2 and prevents the liquid crystal 2 from contacting with the sealant.

The embodiments of the present disclosure further provide a liquid crystal coating method, which uses the liquid crystal coating apparatus as described above, and a schematic view of the liquid crystal coating apparatus in use is as shown in FIG. 2.

For example, the liquid crystal coating method provided by the embodiments of the present disclosure comprises:

S1: uniformly coating a liquid crystal 2 having a predetermined pattern and quantity on a substrate 1 through a nozzle 3;

S2: mildly injecting a highly-pure low-temperature dry gas 7 by a cooling device 6 to the liquid crystal 2 coated on the substrate 1 along a movement trace of the nozzle 3 while coating the liquid crystal 2, so as to reduce a temperature of the liquid crystal 2, lower a fluidity of the liquid crystal 2, improve a viscosity coefficient of the liquid crystal 2, and slow down a diffusion speed of the liquid crystal 2;

S3: providing a sealant in a peripheral region of the substrate 1, and performing a thermal curing on the sealant, so that the liquid crystal 2 has its temperature gradually raised and its fluidity restored during the thermal curing, to fill the entire substrate 1, improve coating quality of the liquid crystal 2 and achieve a uniform cell thickness.

In step S2, for example, the cooling device 6 injects the low-temperature dry gas 7 to the substrate 1 through a slit-type gas outlet 62 and cools the liquid crystal 2 by the low-temperature dry gas 7, to avoid contamination of the liquid crystal 2. For example, the low-temperature dry gas 7 is nitrogen or carbon dioxide, and nitrogen and carbon dioxide have a lower cost and a good cooling effect.

The liquid crystal coating method provided by the embodiments of the present disclosure effectively solves the problem of contamination of the liquid crystal caused by excessively fast diffusion of the liquid crystal without changing design of the display panel; the liquid crystal coating method provided by the embodiments of the present disclosure is easy to implement and does not affect the fabrication process of the display panel; further, the liquid crystal coating method provided by the embodiments of the present disclosure enhance production capacity and has an advantage that the coating method is not limited by a product size and can be widely applied.

The foregoing embodiments merely are exemplary embodiments of the present disclosure, and not intended to define the scope of the present disclosure, and the scope of the present disclosure is determined by the appended claims.

The present application claims priority of Chinese Patent Application No. 201610034957.7 filed on Jan. 19, 2016, the present disclosure of which is incorporated herein by reference in its entirety as part of the present application.

The invention claimed is:

1. A liquid crystal coating apparatus, comprising a liquid crystal nozzle and a cooling device, the cooling device being located behind the nozzle along a movement trace of the nozzle, and the cooling device moving along the movement trace of the nozzle, wherein the liquid crystal coating apparatus further comprises a heat-insulating baffle provided between the nozzle and the cooling device, wherein the heat-insulating baffle is arranged in a direction perpendicular to the movement trace of the nozzle.

2. The liquid crystal coating apparatus according to claim 1, wherein the cooling device includes a gas path system and a gas injection chamber, the gas injection chamber communicating with a gas storage device through the gas path system.

3. The liquid crystal coating apparatus according to claim 2, wherein the gas path system is provided with a flow valve for controlling gas flow.

4. The liquid crystal coating apparatus according to claim 2, wherein a bottom of the gas injection chamber is provided with a slit-type gas outlet.

5. The liquid crystal coating apparatus according to claim 2, wherein the gas injection chamber is configured for injecting a low-temperature dry gas.

6. The liquid crystal coating apparatus according to claim 5, wherein the low-temperature dry gas is nitrogen or carbon dioxide.

7. The liquid crystal coating apparatus according to claim 1, further comprising a hollow square frame, the hollow square frame driving the nozzle and the cooling device to move synchronously, and the nozzle and the cooling device being respectively fixed on two sides of the hollow square frame along a movement direction of the nozzle and the cooling device.

8. The liquid crystal coating apparatus according to claim 1, wherein, as compared with the nozzle, the cooling device is arranged to be closer to the heat-insulating baffle.

9. The liquid crystal coating apparatus according to claim 1, wherein a bottom of the nozzle is provided with an injection hole, and a bottom of the heat-insulating baffle is higher than the injection hole.

10. A liquid crystal coating method, comprising:
 coating a liquid crystal having a predetermined pattern on a substrate through a nozzle; and
 lowering a temperature of the liquid crystal by a cooling device along a movement trace of the nozzle while coating the liquid crystal, so as to lower a fluidity of the liquid crystal,
 wherein the method further comprises: providing a heat-insulating baffle between the nozzle and the cooling device, the heat-insulating baffle being arranged in a direction perpendicular to the movement trace of the nozzle.

11. The liquid crystal coating method according to claim 10, wherein a sealant is provided in a peripheral region of the substrate, the method further comprising:
 performing a thermal curing on the sealant, and at the same time raising the temperature of the liquid crystal to restore the fluidity of the liquid crystal.

12. The liquid crystal coating method according to claim 10, wherein the lowering the temperature of the liquid crystal by the cooling device along the movement trace of the nozzle while coating the liquid crystal comprises injecting, by the cooling device, a low-temperature dry gas to the substrate through a slit-type gas outlet.

13. The liquid crystal coating method according to claim 12, wherein the low-temperature dry gas is nitrogen or carbon dioxide.

* * * * *